United States Patent [19]

Nakagawa et al.

[11] Patent Number: 5,840,200

[45] Date of Patent: Nov. 24, 1998

[54] METHOD OF MANUFACTURING SEMICONDUCTOR DEVICES

[75] Inventors: Satoshi Nakagawa, Toyama; Toyoji Ito, Shiga; Yoji Bito, Toyama; Yoshihisa Nagano, Osaka, all of Japan

[73] Assignee: Matsushita Electronics Corporation, Osaka, Japan

[21] Appl. No.: 788,310

[22] Filed: Jan. 24, 1997

[30] Foreign Application Priority Data

Jan. 26, 1996 [JP] Japan ..................................... 8-011481

[51] Int. Cl.⁶ ................................................. H01L 21/302
[52] U.S. Cl. ................................ 216/6; 216/76; 438/717; 438/722; 438/736; 438/738
[58] Field of Search .................................... 438/717, 722, 438/736, 738; 216/75, 76, 6

[56] References Cited

U.S. PATENT DOCUMENTS

| | | | |
|---|---|---|---|
| 3,836,446 | 9/1974 | Tiefert | 204/192 |
| 3,975,252 | 8/1976 | Fraser et al. | 204/192 |
| 5,254,217 | 10/1993 | Maniar et al. | 156/656 |
| 5,443,688 | 8/1995 | Toure et al. | 216/13 |

FOREIGN PATENT DOCUMENTS

| | | |
|---|---|---|
| 60-247816 | 7/1985 | Japan . |
| 61-248048 | 11/1986 | Japan . |
| 62-092323 | 4/1987 | Japan . |
| 62-120019 | 6/1987 | Japan . |
| 05089662 | 9/1993 | Japan . |
| 07-130712 | 5/1995 | Japan . |
| 07-221070 | 8/1995 | Japan . |
| 08-083756 | 3/1996 | Japan . |
| 08-181128 | 7/1996 | Japan . |

OTHER PUBLICATIONS

"A Gbit–Scale Dram Stocked Capacitor with ECR MOCVD Sr Ti O₃ Over RIE Patterned RuO₂/ Tin Storage Nodes"; Integrated Ferroelectrics; 1995; vol. II, pp. 81–100; Lesaicherre et. al.

"Reactive Ion Etching of Ru O₂ Thin Films Using The Gas Mixture O₂—CF₃ CFH₂"; Wei et. al; J. Vac. Sci. Tech B, vol. 12, No. 6, pp. 3208–3213, Dec. 1994.

"Reactive Ion Etching of Lead Zirconate Titanate (PZT) Thin Film Capacitors"; Vijay et. al.; J. Elect. Soc., vol. 140, No. 9, Sep. 1993.

Yokoyama et al., "High–Temperature Etching of PZT/Pt/TiN Structure by High Density ECR Plasma", International Conference on Solid State Devices and Materials, pp. 721–723 (Aug. 23, 1994).

Charlet et al., "Dry Etching of PZT Films in an ECR Plasma", Proceedings of the International Colloquium on Plasma Processes, pp. 334–339 (Jun. 6–11, 1993).

*Primary Examiner*—Benjamin Utech
*Assistant Examiner*—George Goudreau
*Attorney, Agent, or Firm*—McDermott, Will & Emery

[57] ABSTRACT

A device insulating film, a lower-layer platinum film, a ferroelectric film, an upper-layer platinum film, and a titanium film are sequentially formed on a semiconductor substrate in this order. On the titanium film, a photoresist mask is further formed in a desired pattern. The thickness of the titanium film is adjusted to be 1/10 or more of the total thickness of a multilayer film consisting of the upper-layer platinum film, the ferroelectric film, and the lower-layer platinum film. The titanium film is then subjected to dry etching and the photoresist film is removed by ashing process. The titanium film thus patterned is used as a mask in etching the upper-layer platinum film, the ferroelectric film, and the lower-layer platinum film by a dry-etching method using a plasma of a gas mixture of chlorine and oxygen in which the volume concentration of oxygen gas is adjusted to be 40%. During the dry-etching process, the titanium film is oxidized to provide a high etching selectivity. Subsequently, the titanium film is removed by dry etching using a plasma of chlorine gas.

9 Claims, 5 Drawing Sheets

METHOD OF MANUFACTURING SEMICONDUCTOR DEVICES

BACKGROUND OF THE INVENTION

The present invention relates to a method of manufacturing semiconductor devices and, more particularly, to a method of etching a ferroelectric material, a high dielectric constant material, and platinum.

There has been known a non-volatile memory utilizing spontaneous polarization in a ferroelectric film formed on a semiconductor substrate. There has also been known a DRAM (dynamic RAM) comprising a capacitor formed of a high dielectric constant material on a semiconductor substrate. In the process of manufacturing these types of memories, the technology of micro-fabrication is required to process a ferroelectric material, a high dielectric constant material, and platinum (Pt) used in the electrodes of the memories.

There is a well-known method of processing a ferroelectric material or a high dielectric constant material by dry etching using a photoresist as a mask and a plasma of chlorine ($Cl_2$) gas. However, since each of the ferroelectric material and high dielectric constant material is an oxide compound of metal having a high melting point and a high boiling point, the etching rate thereof is low. To achieve a sufficient selectivity, therefore, the photoresist mask conventionally used in the method should have a considerable thickness, which has rendered micro-fabrication difficult.

SUMMARY OF THE INVENTION

It is therefore an object of the present invention to implement easy micro-fabrication of a ferroelectric material, a high dielectric constant material, and platinum.

To achieve the above object, the present invention provides a method wherein a mask is formed from a metal film likely to be oxidized which has been deposited and patterned on a film to be etched made of at least one of a ferroelectric material, a high dielectric constant material, and platinum. The film to be etched is then etched by using a plasma of a mixture of halogen gas and oxygen gas. In accordance with the method, the metal film formed as the mask is oxidized by the plasma, resulting in a lower etching rate for the mask. By contrast, a higher etching rate is achieved for the film to be etched. Hence, a higher selectivity is obtained to allow easier micro-fabrication of the film to be etched.

The present invention also provides a method wherein lower-layer and upper-layer masks are formed from an insulating material and a metal likely to be oxidized which have been deposited in this order and patterned on a film to be etched made of at least one of a ferroelectric material and a high dielectric constant material. The film to be etched is then etched by using a plasma of a mixture of halogen gas and oxygen gas and, thereafter, the upper-layer mask is removed while the lower-layer mask is left as it is. In accordance with the method, the metal film formed as the upper-layer mask is oxidized by the plasma, resulting in a lower etching rate for the mask. By contrast, a higher etching rate is achieved for the film to be etched. Hence, a higher selectivity is obtained to allow easier micro-fabrication of the film to be etched. Moreover, since the film to be etched is covered with the lower-layer mask during the removal of the upper-layer mask, the film to be etched is not exposed to the etching gas, which suppresses variations in ferroelectric property or high dielectric constant property and degradation thereof. To prevent a residue of the upper-layer mask from being produced, a reducing gas plasma, e.g., a plasma of boron trichloride is used to etch the upper-layer mask.

The present invention also provides a method wherein a mask is formed from an insulating material which has been deposited and patterned on a film to be etched made of at least one of a ferroelectric material and a high dielectric constant material. The film to be etched is then selectively etched by using a gas plasma and, thereafter, only an upper-layer portion of the mask made of the insulating material is removed. In accordance with the method, easier micro-fabrication of the film to be etched is implemented by adopting a dry-etching method using the mask made of the insulating material, compared with the case of using a photoresist mask. Moreover, since the mask is partially removed, the film to be etched is protected during the removal of the mask, which suppresses variations in ferroelectric property or high dielectric constant property and degradation thereof.

DETAILED DESCRIPTION OF THE INVENTION

Figure 1A:
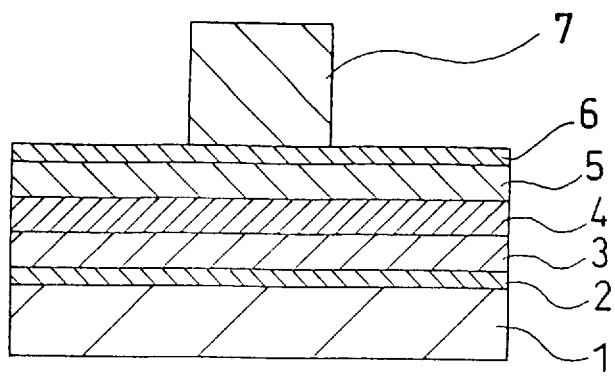
FIGS. 1(a) to 1(e) are cross-sectional views illustrating a process by a method of manufacturing semiconductor devices according to the present invention.

Specific embodiments of a method of manufacturing semiconductor devices according to the present invention will be described with reference to the drawings.

FIGS. 1(a) to 1(e) illustrate the method of manufacturing semiconductor devices according to the present invention, in which are shown: a semiconductor substrate 1 made of single-crystal silicon (Si); a device insulating film 2 made of silicon oxide ($SiO_2$); a lower-layer platinum (Pt) film 3; a ferroelectric film 4 made of SBT as $SrBi_2Ta_3O_9$; an upper-layer platinum (Pt) film 5; a titanium (Ti) film 6; and a photoresist mask 7.

The manufacturing method is implemented by sequentially forming the device insulating film 2, the lower-layer platinum film 3, the ferroelectric film 4, the upper-layer platinum film 5, and the titanium film 6 on the semiconductor substrate 1 in this order. On the titanium film 6, the photoresist mask 7 is further formed in a desired pattern by photolithography (FIG. 1(a)). The device insulating film 2 is formed by CVD. The lower-layer platinum film 3, the upper-layer platinum film 5, and the titanium film 6 are formed by sputtering. The ferroelectric film 4 is formed by sol-gel process (specifically, by spin coating or mist process). The respective thicknesses of the device insulating film 2, lower-layer platinum film 3, ferroelectric film 4, upper-layer platinum film 5, titanium film 6, and photoresist mask 7 are, e.g., 200 nm, 300 nm, 200 nm, 200 nm, 200 nm, and 1200 nm. In this case, the thickness of the titanium film 6 is adjusted to be 1/10 or more of the total thickness of a multilayer film consisting of the upper-layer platinum film 5, the ferroelectric film 4, and the lower-layer platinum film 3.

Figure 1B:
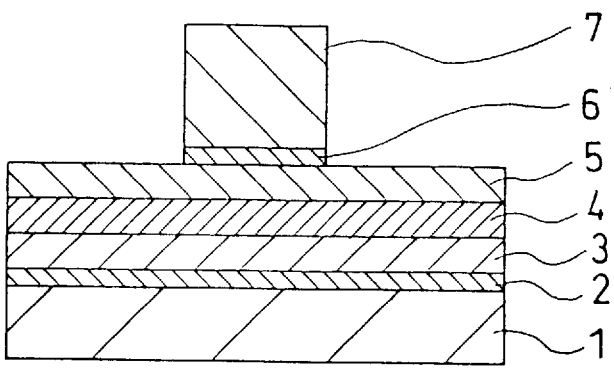
Figure 1C:
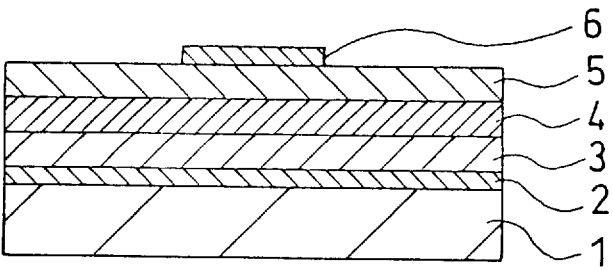

The titanium film 6 is then subjected to dry etching using a plasma of chlorine ($Cl_2$) gas (FIG. 1(b)), followed by the removal of the photoresist film 7 by ashing process using an oxygen ($O_2$) plasma. (FIG. 1(c)).

Figure 1D:
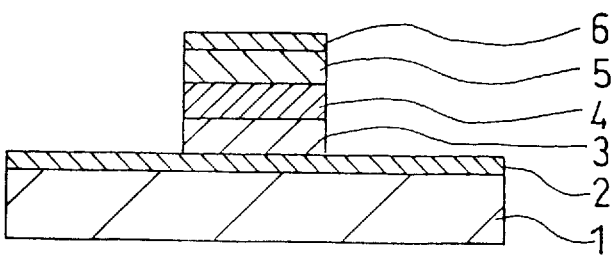

Subsequently, the multilayer film consisting of the upper-layer platinum film 5, the ferroelectric film 4, and the lower-layer platinum film 3 is subjected to dry etching using the patterned titanium film 6 as a mask and a plasma of a gas mixture of chlorine ($Cl_2$) and oxygen ($O_2$) (FIG. 1(d)). The dry-etching process is performed in a dedicated chamber, in which the respective flow rates of the chlorine gas and oxygen gas are adjusted to be 12 cc/minute and 8 cc/minute, the internal pressure is held at 2 Pa, and RF power of 13.56 MHz is applied to the gas mixture at a density of 5 W/cm$^2$, thereby generating the plasma of the gas mixture of chlorine and oxygen. In this case, the volume concentration of the oxygen gas in the mixture gas of chlorine and oxygen is 40%.

Figure 1E:
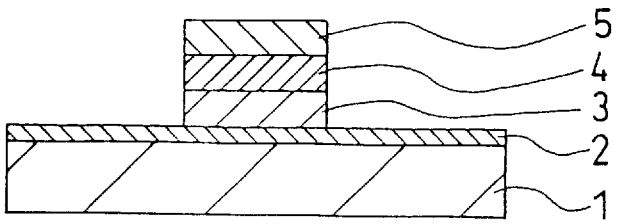

Furthermore, the titanium film 6 is removed by dry etching using a plasma of chlorine gas (FIG. 1(e)). During the dry-etching process, the flow rate of the chlorine gas is adjusted to be 30 cc/minute, the pressure inside the chamber is held at 20 Pa, and RF power of 13.56 MHz is applied to the chlorine gas at a density of 0.7 W/cm$^2$, thereby generating the plasma of the chlorine gas. The foregoing steps are for forming a ferroelectric capacitor on the semiconductor substrate 1 with the device insulating film 2 interposed therebetween. After the step illustrated in FIG. 1(e), there is performed a wiring step (not shown).

Figure 2:
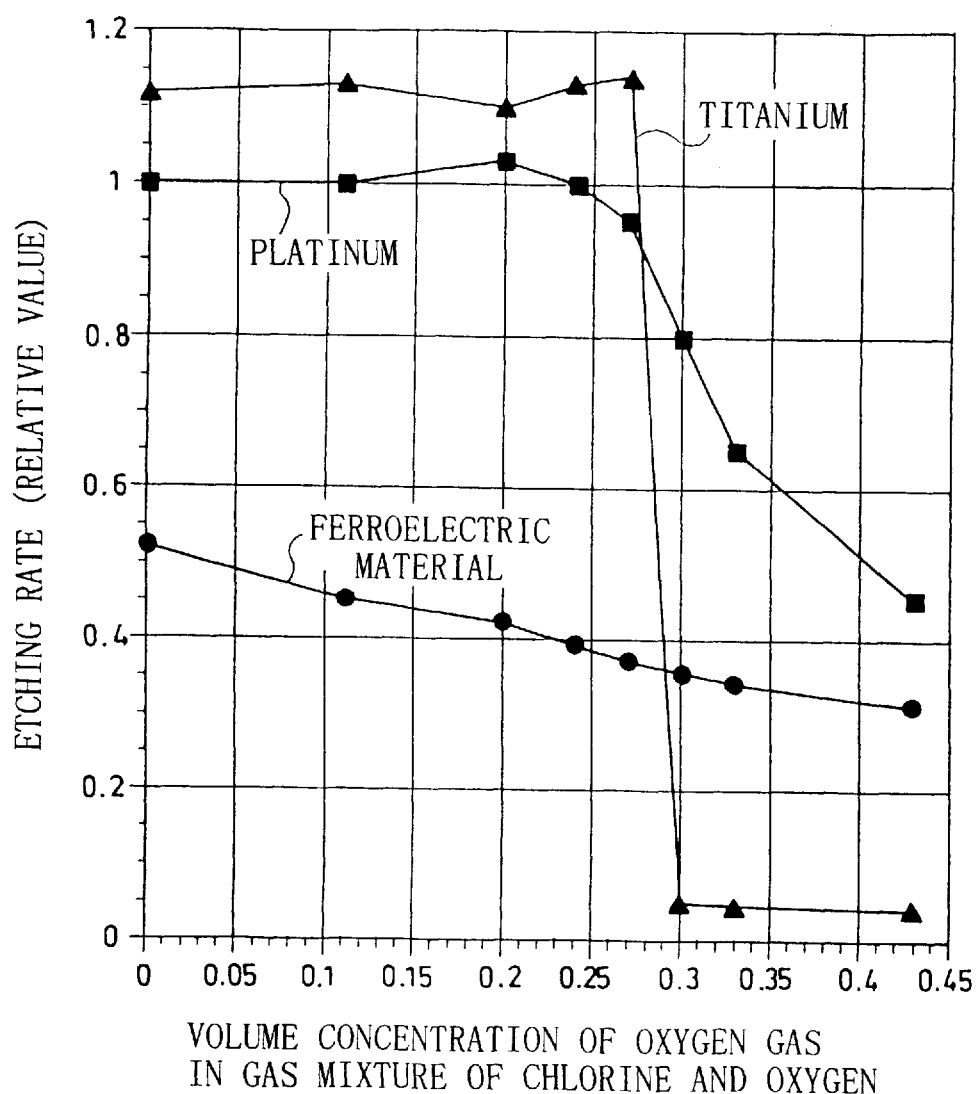
FIG. 2 shows individual relationships between the volume concentration of oxygen gas in a gas mixture of chlorine and oxygen and respective etching rates for platinum, a ferroelectric material, and titanium when dry etching using a plasma of the gas mixture is performed with respect thereto.

FIG. 2 shows individual relationships between the volume concentration of oxygen gas in a gas mixture of chlorine and oxygen and respective etching rates for platinum, a ferroelectric material, and titanium when dry etching using the plasma of the gas mixture is performed with respect thereto, in which the horizontal axis represents the volume concentration of the oxygen gas in the gas mixture of chlorine and oxygen and the vertical axis represents the respective etching rates for platinum, the ferroelectric material, and titanium. The individual etching rates are indicated relative to an etching rate for platinum when the volume concentration of the oxygen gas is 0 (i.e., the volume concentration of the chlorine gas is 100%). The plasma for etching is generated by holding the pressure inside the chamber at 2Pa and applying RF power of 13.56 MHz to the gas mixture at a density of 5 W/cm$^2$.

From FIG. 2., it will be understood that the etching rate for titanium is drastically reduced when the volume concentration of the oxygen gas becomes 27% or more. This is because titanium has been oxidized by the plasma and hence is less likely to be etched. If the volume concentration of the oxygen gas is adjusted to be 30% or more, the etching rate for titanium becomes 1/6 or less of the etching rates for platinum and the ferroelectric material. The thickness of the titanium film 6 is adjusted to be 1/6 or more of the total thickness of the multilayer film consisting of the upper-layer platinum film 5, the ferroelectric film 4, and the lower-layer platinum film 3 as described above, and consequently the unwanted portions of the films 3 to 5 stacked in layers can be etched away, while the patterned titanium film 6 and the wanted portions of the underlying films 3 to 5 stacked in layers are left, as shown in FIG. 1(d).

Thus, according to the present method, the films 3 to 5 stacked in layers are selectively etched by using the titanium film 6 formed and patterned as a mask on the films 3 to 5 made of platinum and the ferroelectric material and by using the plasma of the mixture gas of chlorine and oxygen, resulting in an improved accuracy with which the films 3 to 5 stacked in layers are processed. Moreover, since the photoresist mask 7 is used only for patterning the titanium film 6, the thickness of the photoresist mask 7 can be reduced, which contributes to improved resolution and improved tolerance for a focal depth in an optical system for photolithography. With these advantages, various ferroelectric materials which have remained to be used because of their poor processability become usable, thereby improving the characteristics, reliability, and production yield of a semiconductor device. Alternatively, a titanium layer, a titanium nitride layer, or a titanium oxide layer may be interposed as an adhesion layer between the device insulating film 2 and the lower-layer platinum film 3. It is also possible to interpose a similar adhesion layer between the upper-layer platinum film 5 and the titanium film 6 so that the adhesion layer remaining even after the removal of the titanium film 6 ensures adhesion of the upper-layer platinum film 5 to the oxide silicon film formed after the step illustrated in FIG. 1(e).

As is apparent from FIG. 2, the film to be etched is not limited to such a multilayer film of Pt and SBT as described above. A high selectivity is also exhibited to a single-layer film of Pt or SBT. The present method is also applicable to the etching of a PZT as $PbTiO_3$—$PbZrO_3$ film which is a ferroelectric film or to the etching of a BST as $BaTiO_3$—$SrTiO_3$ film which is a high dielectric constant film. Although the foregoing embodiment has used the titanium (Ti) film as the mask, a mask made of a titanium compound or an alloy containing titanium may be used instead. Alternatively, a mask made of another metal likely to be oxidized such as chromium (Cr), tantalum (Ta), or aluminum (Al) may be used instead. In place of the gas mixture of $Cl_2$ and $O_2$, a gas mixture of another halogen gas such as HBr, $SF_6$, or HCl and $O_2$ may be used as the etching gas. However, since a chloride of platinum (Pt) is higher in vapor pressure than a fluoride of Pt, a chlorine-based gas is preferred to a fluorine-based gas in etching Pt.

As described above, the ferroelectric capacitor has a structure in which the ferroelectric film is interposed between the upper and lower platinum films. To prevent surface leakage on a side face of the ferroelectric film during the use of the resulting semiconductor device, the area of the upper-layer platinum film is preferably smaller than the area of the ferroelectric film. A description will be given below to an etching process of the ferroelectric film and the lower-layer platinum film which is separately performed from an etching process of the upper-layer platinum film.

FIGS. 3(a) to 3(d) illustrate another process by the method of manufacturing semiconductor devices according to the present invention, in which are shown: a semiconductor substrate 11 made of single-crystal silicon (Si); a device insulating film 12 made of silicon oxide ($SiO_2$); a lower-layer platinum (Pt) film 13; a ferroelectric film 14 made of SBT as $SrBi_2Ta_3O_9$; an upper-layer platinum (Pt) film 15; a mask insulating film 16 made of NSG (non-doped silicate glass) which is a silicon oxide ($SiO_2$); and a titanium (Ti) film 17.

Figure 3A:
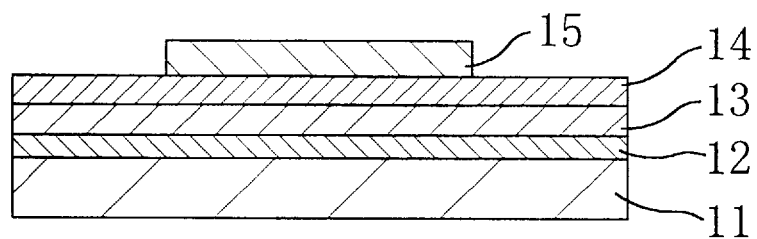
FIGS. 3(a) to 3(d) are cross-sectional views illustrating another process by the method of manufacturing semiconductor devices according to the present invention.
Figure 3B:
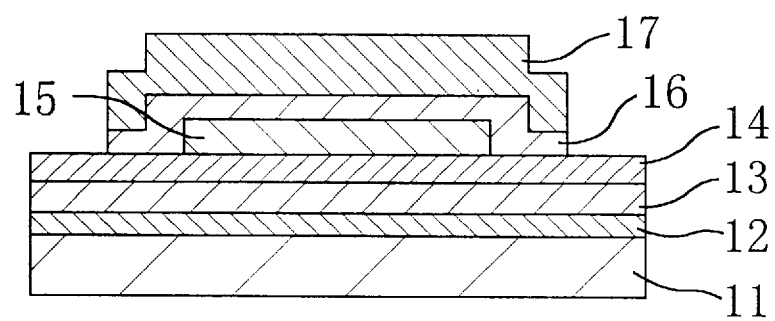

The manufacturing method is implemented by sequentially forming the device insulating film 12, the lower-layer platinum film 13, the ferroelectric film 14, and the upper-layer platinum film 15 on the semiconductor substrate 11 in this order, followed by the etching of the upper-layer platinum film into a desired pattern (FIG. 3(a)). The device insulating film 12 is formed by CVD. The lower-layer and upper-layer platinum films 13 and 15 are formed by sputtering. The ferroelectric film 14 is formed by sol-gel process (specifically, by spin coating or mist process). The respective thicknesses of the device insulating film 12, the lower-layer platinum film 13, the ferroelectric film 14, and the upper-layer platinum film 15 are, e.g., 100 nm, 200 nm, 200 nm, and 200 nm. Since only the upper-layer platinum film 15 is etched here, a dry-etching method using a photoresist mask can be applied to the etching. The etching gas is composed of, e.g., chlorine ($Cl_2$) gas. The photoresist mask is removed by ashing process using an oxygen ($O_2$) plasma.

Next, the mask insulating film 16 is formed by CVD to cover the patterned upper-layer platinum film 15, followed by the formation of the titanium film 17 by sputtering on the mask insulating film 16. Thereafter, the titanium film 17 and the mask insulating film 16 are etched into a pattern larger than the upper-layer platinum film 15 (FIG. 3(b)). The respective thicknesses of the mask insulating film 16 and the titanium film 17 are, e.g., 100 nm and 200 nm. In this case also, a dry-etching method using a photoresist mask can be applied to the etching. The etching gas for the titanium film 17 is, e.g., a $Cl_2$ gas and the etching gas for the mask insulating film 16 is, e.g., $CF_4$ gas. The photoresist mask is removed by ashing process using an oxygen ($O_2$) plasma.

Figure 3C:
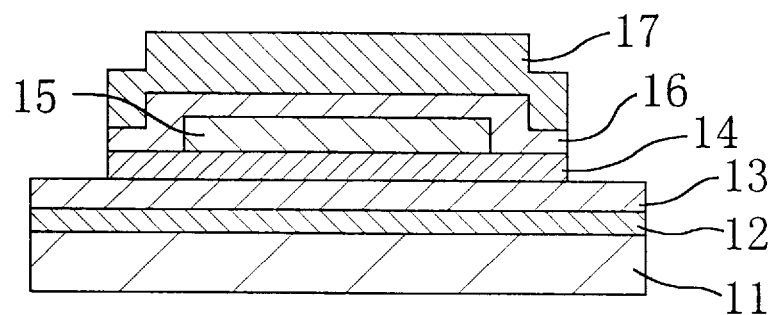

Subsequently, the ferroelectric film 14 is subjected to dry etching using the patterned titanium film 17 and insulating film 16 as a mask and a plasma of a gas mixture of chlorine ($Cl_2$) and oxygen ($O_2$) (FIG. 3(c)). During the dry-etching process, the titanium film 17 is partially changed into titanium oxide ($TiO_2$).

Figure 3D:
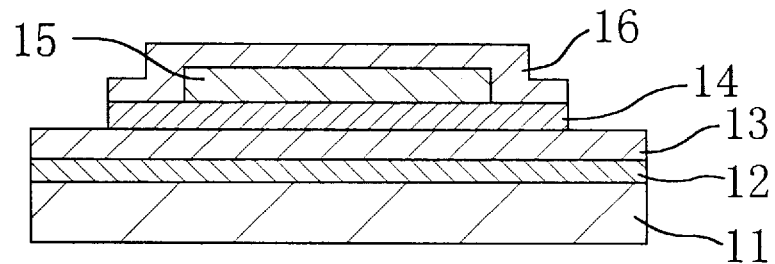

Furthermore, the titanium film 17 is removed by dry etching using a reducing plasma of boron trichloride ($BCl_3$) gas, while the insulating film 16 is left as it is (FIG. 3(d)). In this case, the flow rate of boron trichloride is adjusted to be 80 cc/minute, the pressure inside the chamber is held at 13.3 Pa (=100 mTorr), and RF power of 115 W is applied, thereby generating the plasma of boron trichloride gas. After the step illustrated in FIG. 3(d), there is performed a wiring step (not shown) including perforation of the insulating film 16.

Thus, according to the present method, the titanium film 17 is patterned to form a mask on the ferroelectric film 14 and the ferroelectric film 14 is selectively etched by using the plasma of the gas mixture of chlorine and oxygen, resulting in an improved accuracy with which the ferroelectric film 14 is processed. In addition, the titanium film 17 used as the mask can be removed completely.

Figure 4:
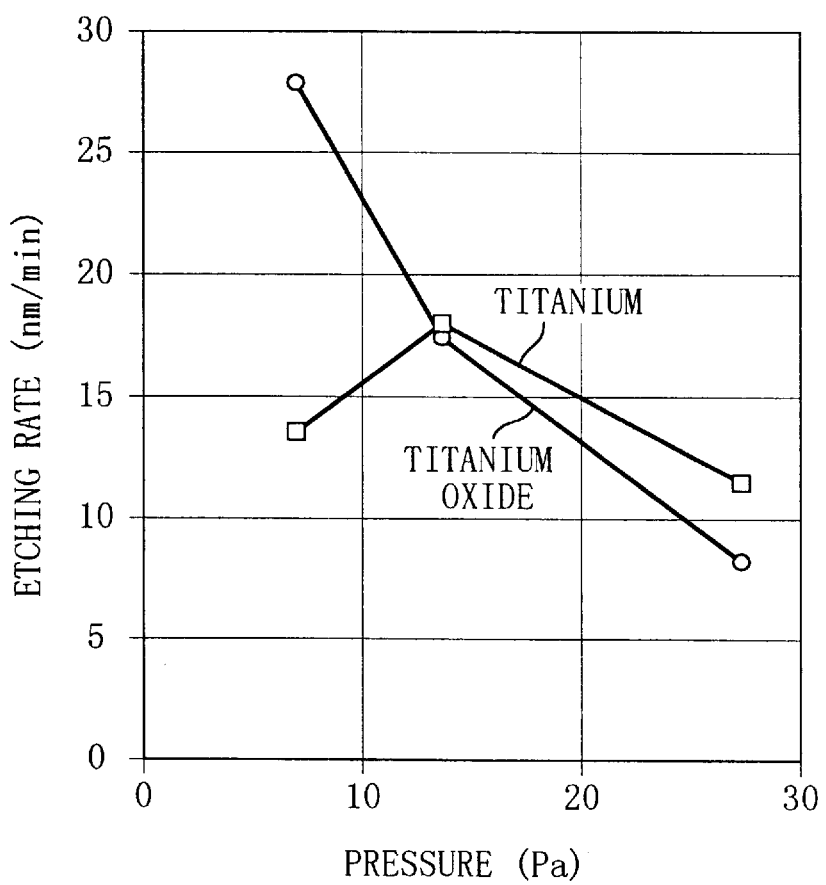
FIG. 4 shows individual relationships between the pressure inside a chamber and respective etching rates for titanium and titanium oxide when dry etching using a plasma of boron trichloride gas is performed with respect thereto.

FIG. 4 shows individual relationships between the pressure inside a chamber and respective etching rates for titanium and titanium oxide when dry etching using the plasma of the boron trichloride gas is performed with respect thereto. From the drawing, it will be understood that the etching rate for titanium becomes substantially equal to the etching rate for titanium oxide when the pressure is 13.3 Pa. Accordingly, no residue of titanium or titanium oxide is observed when the titanium film 17 is etched under the foregoing conditions so that the wiring step is not hindered. Moreover, since the ferroelectric film 14 is covered with the mask insulating film 16 during the removal of the titanium film 17, the ferroelectric film 14 is not exposed to the etching gas, which prevents variations in ferroelectric property and degradation thereof. As a result of an experiment, 15 $\mu C/cm^2$ is observed as residual paralyzation in the ferroelectric film 14 and the voltage resistance thereof is 30 V. Alternatively, titanium layers, titanium nitride layers, or titanium oxide layers may be interposed as adhesion layers between the device insulating film 12 and the lower-layer platinum film 13 and between the upper-layer platinum film 15 and the mask insulating film 16, respectively.

The present method is also applicable to the etching of a PZT film which is a ferroelectric film and to the etching of a BST film which is a high dielectric constant film. The mask insulating film 16 may also be composed of a silicon nitride ($Si_3N_4$) film. However, the use of gas containing hydrogen such as ammonia ($NH_3$) gas in the formation of the silicon nitride film may degrade the ferroelectric film 14, so that a film formation method should be determined carefully. Instead of the titanium film 17, the mask may be composed of a titanium compound, an alloy containing titanium, or another metal likely to be oxidized such as chromium (Cr), tantalum (Ta), or aluminum (Al). Instead of the boron trichloride ($BCl_3$) gas, another chlorine-based gas such as $Cl_2$, $CHCl_3$, or HCl may be used to etch the titanium film 17. However, the use of the boron trichloride ($BCl_3$) gas is most preferred in terms of preventing a residue from being produced. A dry-etching method using the multilayer film of NSG and titanium as a mask is also applicable to the etching of the upper-layer platinum film 15. The upper-layer platinum film 15 may be etched using only the titanium film or NSG film as a mask. It is to be noted that the selectivities with respect to titanium, NSG, and the photoresist are in decreasing order. In the case of using a single-layer mask, therefore, the highest selectivity is exhibited to the mask composed of the titanium film among the masks composed of titanium, NSG, and the photoresist. Alternatively, the ferroelectric film 14 and the lower-layer platinum film 13 may be etched simultaneously.

FIGS. 5(a) to 5(d) illustrate another process by the method of manufacturing semiconductor devices according to the present invention, in which are shown: a semiconductor substrate 21 made of single-crystal silicon (Si); a device insulating film 22 made of silicon oxide ($SiO_2$); a lower-layer platinum (Pt) film 23; a ferroelectric film 24 made of SBT as $SrBi_2Ta_3O_9$; an upper-layer platinum (Pt) film 25; and a mask insulating film 26 made of NSG.

Figure 5A:
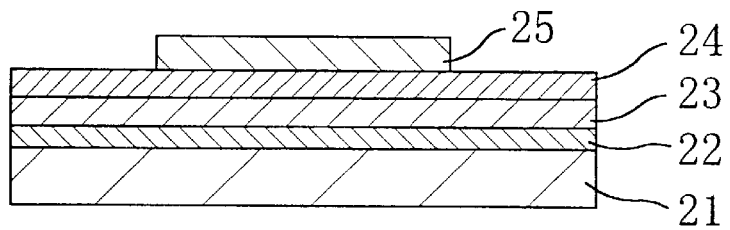
FIGS. 5(a) to 5(d) are cross-sectional views illustrating still another process by the method of manufacturing semiconductor devices according to the present invention.

The manufacturing method is implemented by sequentially forming the device insulating film 22, the lower-layer platinum film 23, the ferroelectric film 24, and the upper-layer platinum film 25 on the semiconductor substrate 21 in this order, followed by the etching of the upper-layer platinum film 25 into a desired pattern (FIG. 5(a)), similarly to the step illustrated in FIG. 3(a).

Figure 5B:
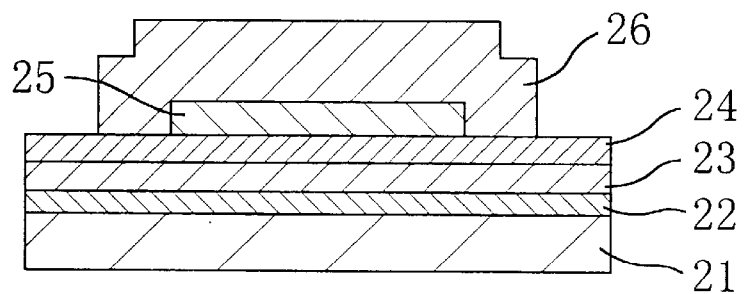

Next, the mask insulating film 26 is then formed by CVD to cover the patterned upper-layer platinum film 25, which is then etched into a pattern larger than the upper-layer platinum film 25 (FIG. 5(b)). The thickness of the mask insulating film 26 is, e.g., 500 nm. The etching process can be performed by a dry-etching method using a photoresist mask. The etching gas is a fluorine-based gas such as $CF_4$ or $CHF_3$. The photoresist mask is removed by ashing process using an oxygen ($O_2$) plasma.

Figure 5C:
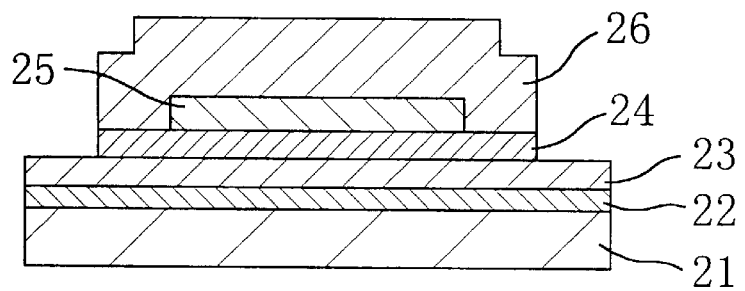

Subsequently, the ferroelectric film 24 is subjected to dry etching using the patterned insulating film 26 as a mask and a plasma of a gas mixture of chlorine ($Cl_2$) and oxygen ($O_2$) (FIG. 5(c)).

Figure 5D:
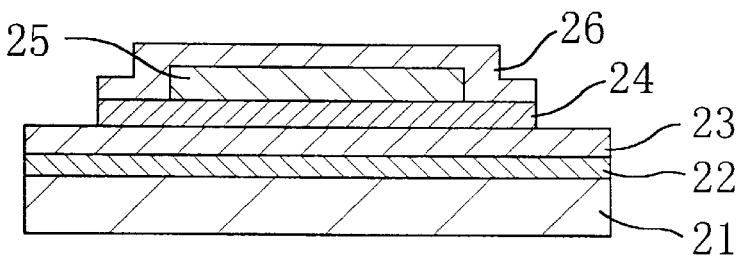

Furthermore, the mask insulating film 26 is partially removed by dry etching using a plasma of fluorine-based gas such as $CF_4$ or $CHF_3$ (FIG. 5(d)). The etching time is adjusted such that the thickness of the mask insulating film 26 becomes, e.g., 100 nm. After the step illustrated in FIG. 5(d), there is performed a wiring step (not shown) including perforation of the insulating film 26.

The present method allows easier micro-fabrication of the ferroelectric film 24 by adopting a dry-etching method using the mask insulating film 26 made of NSG. Moreover, since the ferroelectric film 24 is covered with the mask insulating film 26 in the step illustrated in FIG. 5(d), the ferroelectric film 24 is not exposed to the etching gas, which suppresses variations in ferroelectric property and degradation thereof. As a result of an experiment, 13 to 15 $\mu C/cm^2$ is observed as residual polarization in the ferroelectric film 24 and the voltage resistance thereof is 25 to 30 V. Alternatively, titanium layers, titanium nitride layers, or titanium oxide layers may be interposed as adhesion layers between the device insulating film 22 and the lower-layer platinum film 23 and between the upper-layer platinum film 25 and the mask insulating film 26, respectively.

The present method is also applicable to the etching of a PZT film which is a ferroelectric film and to the etching of a BST film which is a high dielectric constant film. The mask insulating film 26 may be a silicon nitride ($Si_3N_4$) film. Alternatively, the ferroelectric film 24 and the lower-layer platinum film 23 may be etched simultaneously.

We claim:

1. A method of manufacturing semiconductor devices, comprising the steps of:

forming a film to be etched on a semiconductor substrate, said film to be etched being made of at least one of a ferroelectric material, a high dielectric constant material, and platinum;

forming a patterned mask made of a metal to be oxidized on said film to be etched; and selectively etching said film to be etched by using said patterned mask as an etching mask and a plasma of a gas mixture of chlorine and oxygen.

2. A method according to claim 1, wherein said step of forming the mask comprises the step of forming a film made of at least one of titanium, a titanium compound, and an alloy containing titanium.

3. A method according to claim 1, wherein said step of selectivity etching the film to be etched comprises the step of adjusting a volume concentration of oxygen gas in said gas mixture to be 30% or more.

4. A method of manufacturing semiconductor devices, comprising the steps of:

forming a film to be etched on a semiconductor substrate, said film to be etched being made of at least one of a ferroelectric material and a high dielectric constant material;

forming a patterned multilayer mask on said film to be etched, said multilayer mask comprising a lower-layer mask made of an insulating material and an upper-layer mask made of a metal likely to be oxidized on said lower-layer mask;

selectively etching said film to be etched by using an oxidizing and halogenating gas plasma; and removing said upper-layer mask while leaving said lower-layer mask.

5. A method according to claim 4, wherein said step of forming the lower-layer mask comprises the step of forming a film made of silicon oxide.

6. A method according to claim 4, wherein said step of forming the upper-layer mask comprises the step of forming a film made of at least one of titanium, a titanium compound, and an alloy containing titanium.

7. A method according to claim 6, wherein said step of removing the upper-layer mask comprises the step of etching said upper-layer mask by using a reducing gas plasma under such a condition that titanium and titanium oxide are etched at the same rate.

8. A method according to claim 7, wherein said step of removing the upper-layer mask comprises the step of selecting a reducing gas plasma of boron trichloride.

9. A method of manufacturing semiconductor devices, comprising the steps of:

forming a film to be etched on a semiconductor substrate, said film to be etched being made of at least one of a ferroelectric material and a high dielectric constant material;

forming an electrode pattern made of platinum on said film to be etched;

forming a patterned mask made of an insulating material on said film to be etched, said patterned mask being larger than said electrode pattern and covering said electrode pattern; and selectively etching said film to be etched by using said patterned mask as an etching mask and a gas plasma.

* * * * *

UNITED STATES PATENT AND TRADEMARK OFFICE
CERTIFICATE OF CORRECTION

PATENT NO. : 5,840,200
DATED : November 24, 1998
INVENTOR(S) : Nakagawa et al.

It is certified that error appears in the above-identified patent and that said Letters Patent is hereby corrected as shown below:

In the Claims:

Claim 9, line 9, after "material" insert --comprised of silicon oxide--.

Signed and Sealed this

Twenty-sixth Day of September, 2000

Attest:

Q. TODD DICKINSON

*Attesting Officer*     *Director of Patents and Trademarks*